(12) United States Patent
Lin

(10) Patent No.: US 7,518,924 B2
(45) Date of Patent: Apr. 14, 2009

(54) NOR ARCHITECTURE MEMORY AND OPERATION METHOD THEREOF

(75) Inventor: Yung-Feng Lin, Taoyuan County (TW)

(73) Assignee: Macronix International Co., Ltd., Hsinchu (TW)

( * ) Notice: Subject to any disclaimer, the term of this patent is extended or adjusted under 35 U.S.C. 154(b) by 100 days.

(21) Appl. No.: 11/672,063

(22) Filed: Feb. 7, 2007

(65) Prior Publication Data

US 2008/0186764 A1 Aug. 7, 2008

(51) Int. Cl.
*G11C 11/34* (2006.01)
(52) U.S. Cl. .................. 365/185.18; 365/185.25
(58) Field of Classification Search ............ 365/185.05, 365/185.18, 185.25, 185.29, 185.24
See application file for complete search history.

(56) References Cited

U.S. PATENT DOCUMENTS 7,313,018 B2 * 12/2007 Chen .................. 365/185.02
7,414,888 B2 * 8/2008 Yeh .................... 365/185.17

* cited by examiner

*Primary Examiner*—Son T Dinh
*Assistant Examiner*—Hien N Nguyen
(74) *Attorney, Agent, or Firm*—Thomas, Kayden, Horstemeyer & Risley

(57) ABSTRACT

An operation method of a NOR architecture memory includes the following steps. First, a target word line is selected. Next, an initial enable voltage is applied to the target word line to charge the target word line. Then, the initial enable voltage is switched to a target voltage after a pre-charge time to make the target word line be charged to the target voltage. The initial enable voltage is higher than the target voltage. The pre-charge time corresponds to the initial enable voltage and the target voltage.

14 Claims, 5 Drawing Sheets

NOR ARCHITECTURE MEMORY AND OPERATION METHOD THEREOF

BACKGROUND OF THE INVENTION

1. Field of the Invention

The invention relates in general to a NOR architecture memory and an operation method thereof, and more particularly to a NOR architecture memory capable of reducing a delay of a word line and an operation method thereof.

2. Description of the Related Art

Non-volatile memories are used in various present applications, and a flash memory is one of the non-volatile memories. Data may be written into or read from the flash memory, and the data stored in the flash memory can be held without consuming any power. So, the flash memory has been used in various applications of data storage. The flash memory includes many memory cells arranged in an array having m rows and n columns, wherein m and n are positive integers. Each memory cell is enabled by a corresponding word line. When the flash memory is being operated, the corresponding bit line and the corresponding word line are enabled according to the to-be-operated memory cell.

The architectures of the flash memories may be classified into a NOR architecture and an NAND architecture. The NOR architecture flash memory has the advantage of high-speed random reading, but has the disadvantage of low writing speed, while the NAND architecture flash memory has the opposite advantage and opposite disadvantage. One of the trends of manufacturing the flash memory is to utilize the NOR architecture to implement the NAND specification to make the manufactured flash memory have both of the advantages. However, in order to implement NAND specification using NOR architecture, the word line may have a relative large resistance.

This relative-large resistance increases the RC time constant of the word line so that the NOR architecture flash memory has a delay when selecting the word line. So, it is an important subject to shorten the delay of the word line to make the word line be quickly charged to the target voltage. FIG. 1A (Prior Art) is a schematic illustration showing an example of a conventional word line. As shown in FIG. 1A, a driver 101, a driver 102 and a metal wire 103 are utilized such that a word line WL is charged from two sides simultaneously and the delay of the word line can be shortened.

FIG. 1B (Prior Art) is a schematic illustration showing another example of the conventional word line. As shown in FIG. 1B, a metal bypass 104 is utilized, and a metallic contact 105 is formed every N memory cells on the word line WL so that the word line WL may be rapidly charged through the metal bypass 104 and the metallic contact 105 and the delay of the word line may be shortened, wherein N is a positive integer. However, the above-mentioned methods can effectively shorten the delay of the word line, but the area of the flash memory is enlarged, and the requirement cannot be satisfied.

SUMMARY OF THE INVENTION

The invention is directed to a NOR architecture memory and an operation method thereof, in which a target word line is charged with a higher initial enable voltage within a pre-charge time so that the delay of the target word line is reduced.

According to a first aspect of the present invention, an operation method of a NOR architecture memory is provided. The method includes the following steps. First, a target word line is selected. Next, an initial enable voltage is applied to the target word line to charge the target word line. Next, the initial enable voltage is switched to a target voltage after a pre-charge time to make the target word line be charged to the target voltage, wherein the initial enable voltage is higher than the target voltage. The pre-charge time corresponds to the initial enable voltage and the target voltage.

According to a second aspect of the present invention, a NOR architecture memory is provided. The NOR architecture memory includes a NOR architecture memory cell array, m word lines, a row decoder and a control circuit, wherein m is a positive integer. The NOR architecture memory cell array has a plurality of memory cells arranged in an array having m rows and n columns, wherein n is a positive integer. The m word lines respectively correspond to the m rows of memory cells, wherein each word line is coupled to n gates of the corresponding row of memory cells. The row decoder selects one of the word lines as a target word line. The control circuit coupled to the row decoder applies an initial enable voltage to the target word line to charge the target word line. After a pre-charge time, the control circuit switches the initial enable voltage to a target voltage to make the target word line be charged to the target voltage, wherein the initial enable voltage is higher than the target voltage.

The invention will become apparent from the following detailed description of the preferred but non-limiting embodiment. The following description is made with reference to the accompanying drawings.

DETAILED DESCRIPTION OF THE INVENTION

The invention provides a NOR architecture memory and an operation method thereof capable of charging a target word line with a higher initial enable voltage within a pre-charge time so as to reduce the delay of the target word line.

Figure 1A:
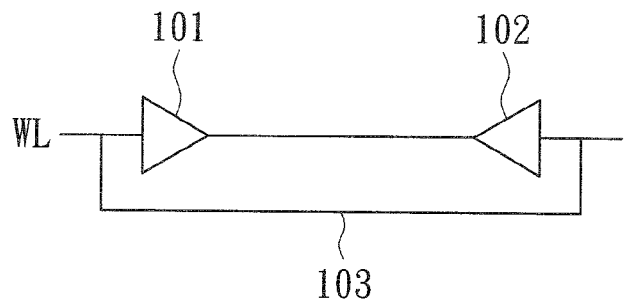
FIG. 1A (Prior Art) is a schematic illustration showing an example of a conventional word line.
Figure 1B:
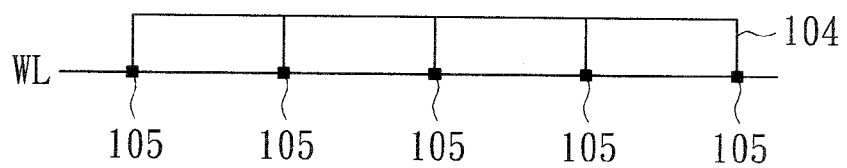
FIG. 1B (Prior Art) is a schematic illustration showing another example of the conventional word line.
Figure 2:
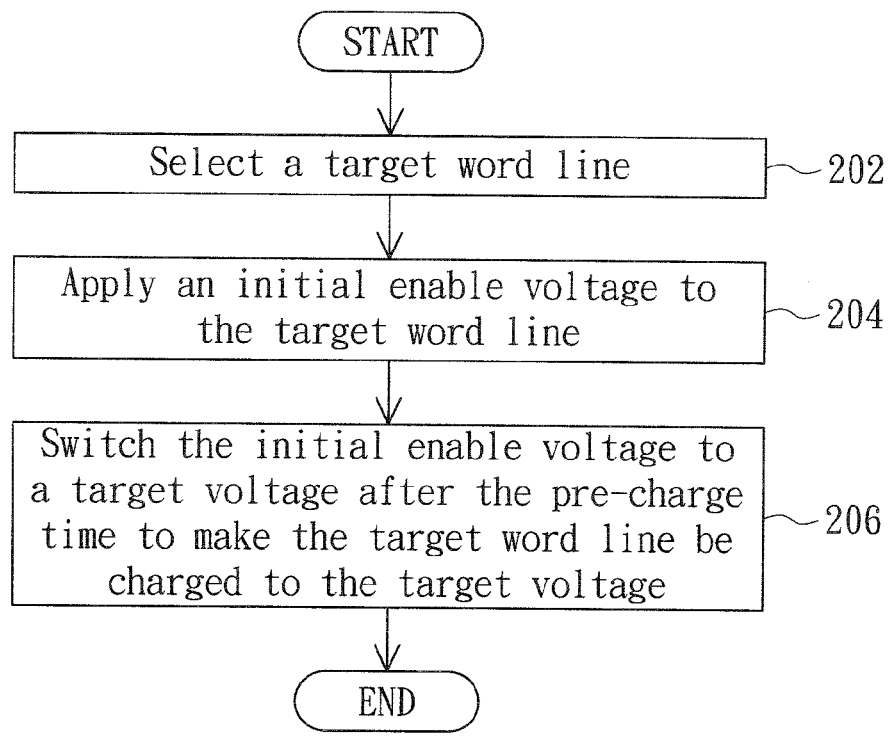
FIG. 2 is a flow chart showing an operation method of a NOR architecture memory according to a preferred embodiment of the invention.

FIG. 2 is a flow chart showing an operation method of a NOR architecture memory according to a preferred embodiment of the invention. First, in step 202, a target word line for enabling a to-be-operated memory cell is selected. Next, in step 204, an initial enable voltage is applied to the target word line to charge the target word line. Next, in step 206, the initial enable voltage is switched to a target voltage after a pre-charge time to make the target word line be charged to the target voltage. The initial enable voltage is higher than the target voltage.

The initial enable voltage is substantially a high level voltage within the NOR architecture memory and functions to charge the target word line with a higher speed. The target voltage makes the target word line enable the to-be-operated memory cell. That is, when the target word line is charged to the target voltage, a row of memory cells corresponding to the target word line is enabled. In addition, in step 206, the target word line is substantially charged to a pre-charge voltage, which is slightly lower than the target voltage, within the pre-charge time. The pre-charge time corresponds to the initial enable voltage and the target voltage. The more the initial enable voltage is higher than the target voltage, the less the pre-charge time is.

Figure 3:
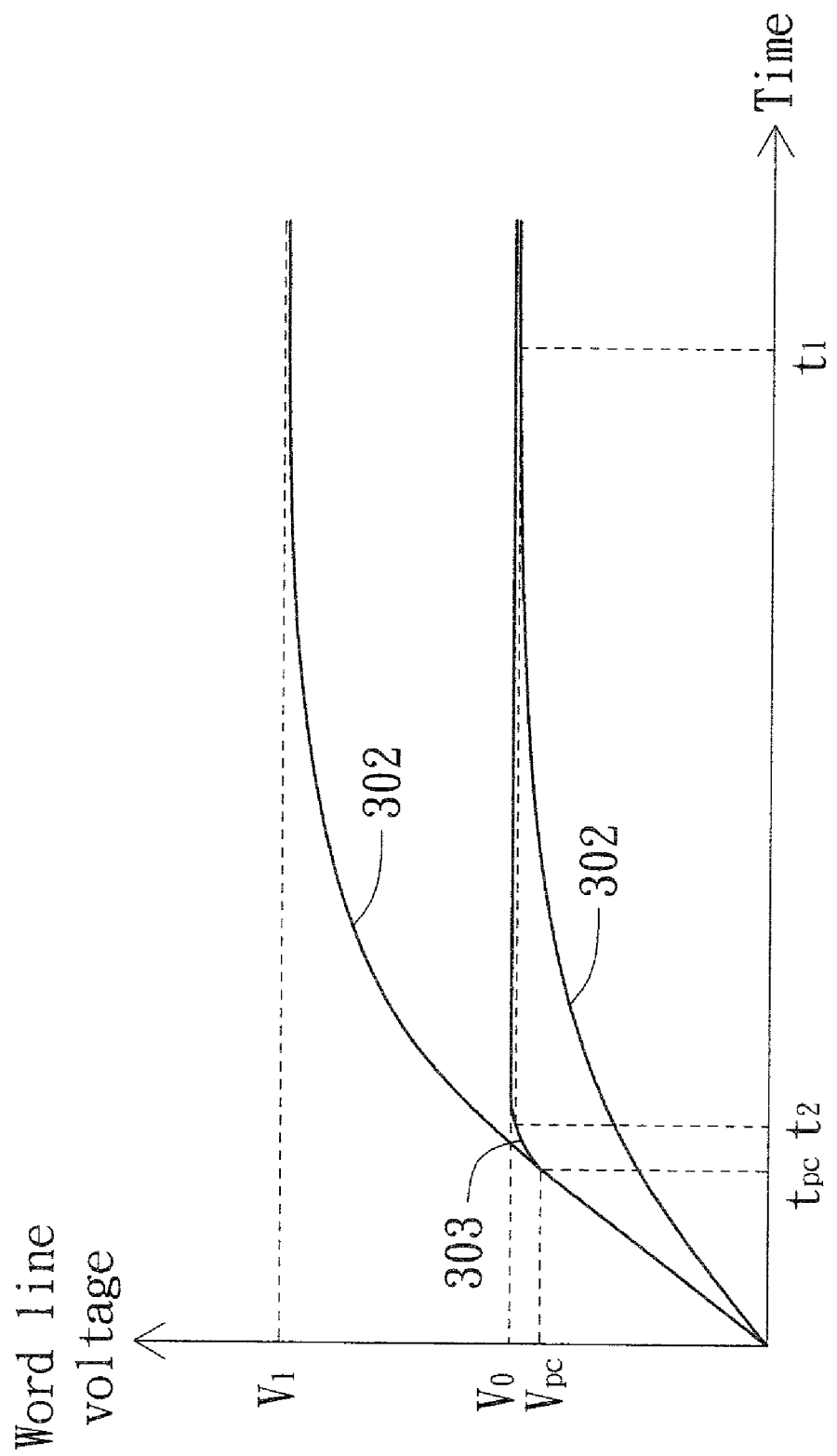
FIG. 3 shows waveforms of word line voltages versus time according to the preferred embodiment of the invention.

FIG. 3 shows waveforms of word line voltages versus time according to the preferred embodiment of the invention. A curve 301 is a voltage curve representing that the word line is charged with a target voltage $V_0$. At time $t_1$, a voltage level of the word line is judged as being capable of enabling the to-be-operated memory cell, and this voltage level is substantially equal to 0.95 $V_0$ to 0.98 $V_0$. A curve 302 is a voltage curve representing that the word line is charged by an initial enable voltage $V_1$. A curve 303 is a voltage curve representing that the word line is charged according to the operation method of the NOR architecture memory according to the preferred embodiment of the invention. At the beginning, the word line is charged with the initial enable voltage $V_1$. After a pre-charge time $t_{pc}$, the word line is charged with the target voltage $V_0$. Thus, at time $t_2$, the voltage level of the word line is judged as being capable of enabling the to-be-operated memory cell. Consequently, the charge time of $(t_1-t_2)$ is saved, and the delay of the word line is shortened.

Figure 4:
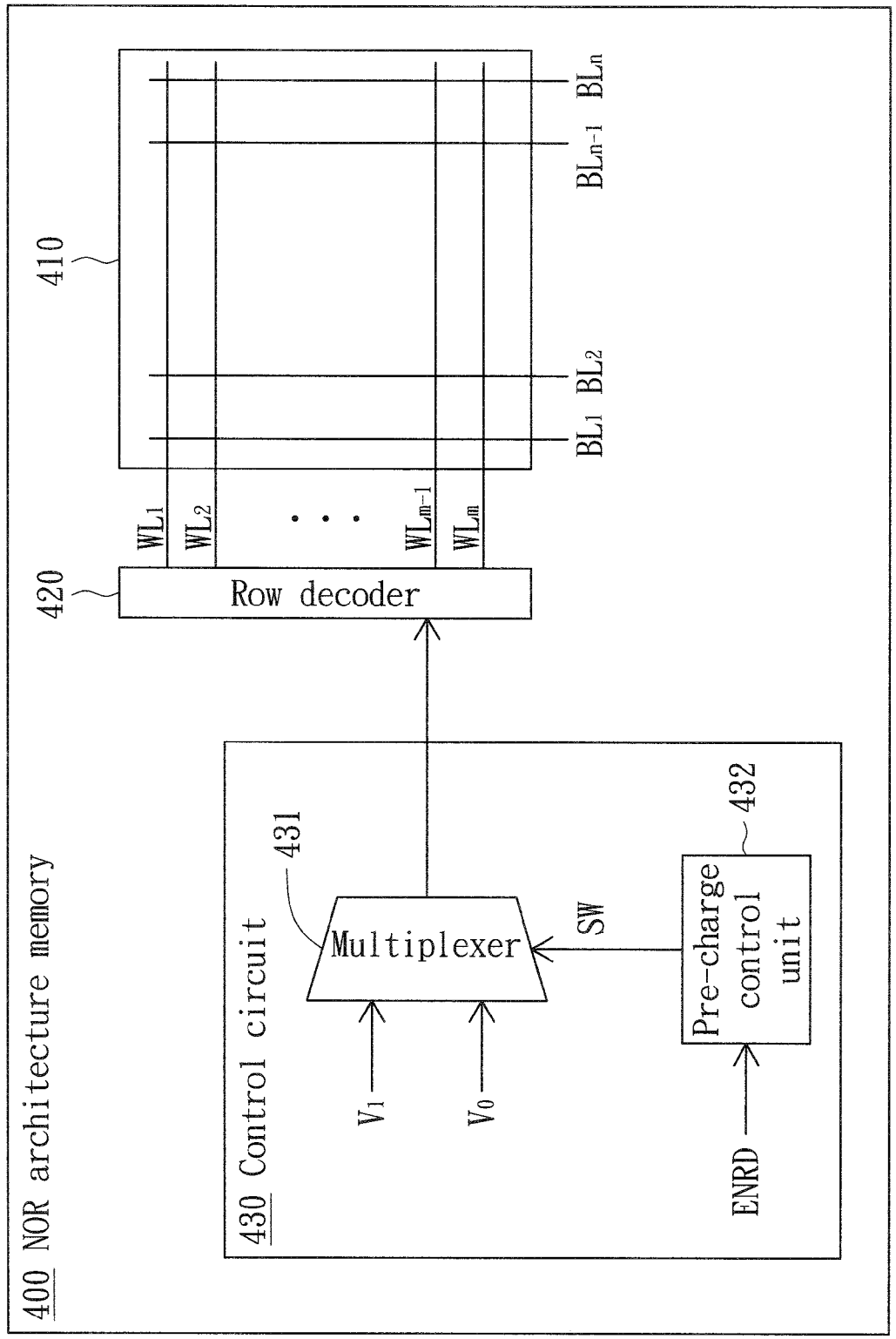
FIG. 4 is a block diagram showing the NOR architecture memory according to the preferred embodiment of the invention.

FIG. 4 is a block diagram showing a NOR architecture memory 400 according to the preferred embodiment of the invention. Referring to FIG. 4, the NOR architecture memory 400, such as a non-volatile memory, or a flash memory, includes a NOR architecture memory cell array 410, m word lines $WL_1$ to $WL_m$, a row decoder 420 and a control circuit 430. The NOR architecture memory cell array 410 has multiple memory cells (not shown), which are arranged in an array having m rows and n columns, wherein m and n are positive integers. Each memory cell is coupled to a corresponding one of the word lines $WL_1$ to $WL_m$ and a corresponding one of bit lines $BL_1$ to $BL_n$. Each of the word lines $WL_1$ to $WL_m$ is coupled to n gates of the corresponding row of memory cells.

The row decoder 420 selects one of the m word lines as the target word line. The control circuit 430 is coupled to the row decoder 420, applies the initial enable voltage $V_1$ to the target word line to charge the target word line, and switches the initial enable voltage $V_1$ to the target voltage $V_0$ to make the target word line be charged to the target voltage $V_0$ after the pre-charge time $t_{pc}$. The initial enable voltage $V_1$ is higher than the target voltage $V_0$. The pre-charge time $t_{pc}$ corresponds to the initial enable voltage $V_1$ and the target voltage $V_0$. In the pre-charge time $t_{pc}$, the target word line is charged to a pre-charge voltage $V_{pc}$, which is slightly lower than the target voltage $V_0$.

The control circuit 430 includes a multiplexer 431 and a pre-charge control unit 432. The pre-charge control unit 432 is controlled by an enable reading signal ENRD to output a switching signal SW. The multiplexer 431 has a first input terminal coupled to the initial enable voltage $V_1$, a second input terminal coupled to the target voltage $V_0$, and a control terminal for receiving the switching signal SW. The multiplexer 431 decides to output the initial enable voltage $V_1$ or the target voltage $V_0$ to the row decoder 420 to charge the target word line according to the switching signal SW. For example, when the voltage level of the switching signal SW is low, the multiplexer 431 outputs the initial enable voltage $V_1$ to the row decoder 420. When the voltage level of the switching signal SW is high, the multiplexer 431 outputs the target voltage $V_0$ to the row decoder 420.

Figure 5:
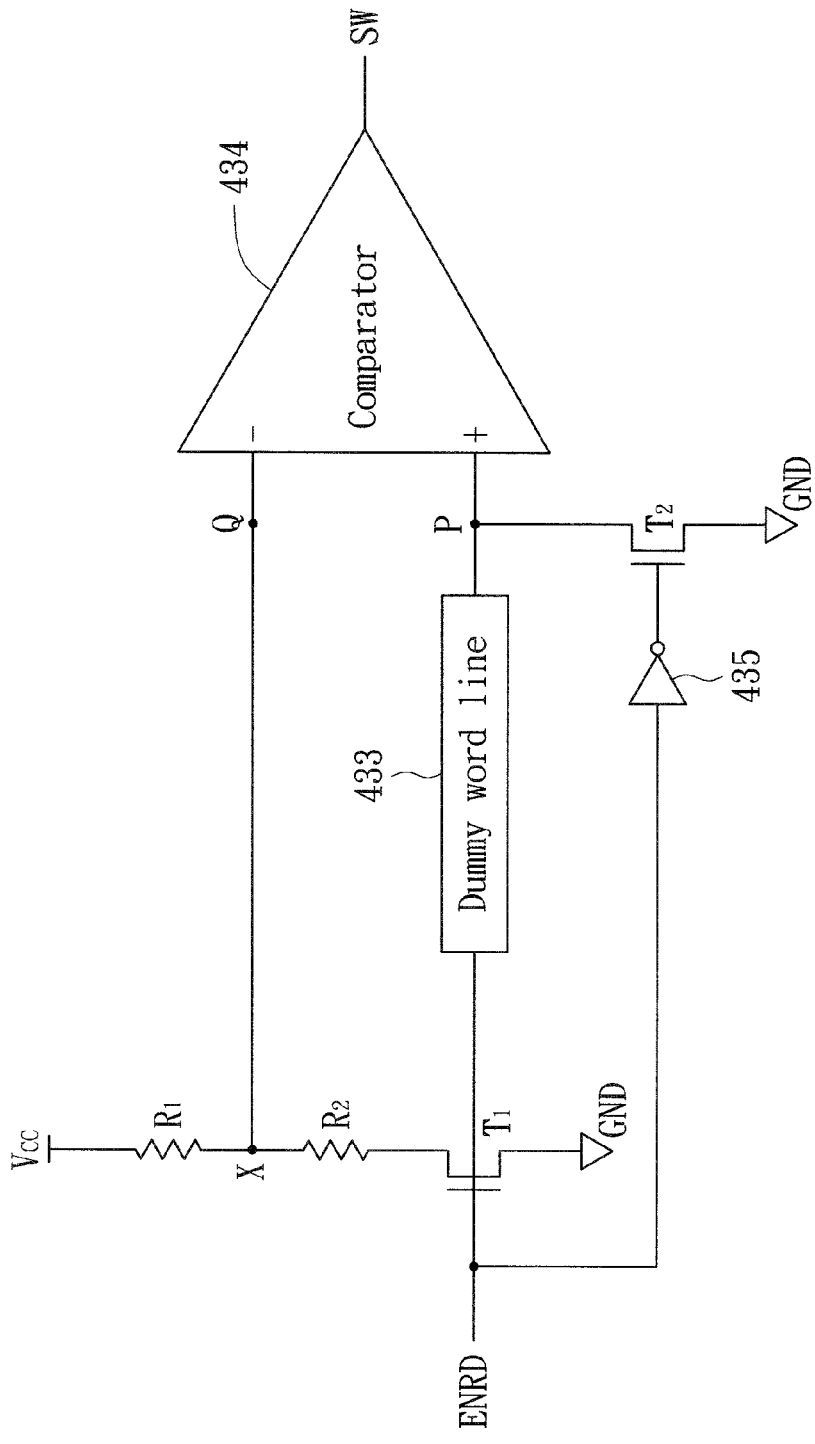
FIG. 5 is a block diagram showing the pre-charge control unit 432 according to the preferred embodiment of the invention.

FIG. 5 is a block diagram showing the pre-charge control unit 432 according to the preferred embodiment of the invention. Referring to FIG. 5, the pre-charge control unit 432 includes a first resistor $R_1$, a second resistor $R_2$, a first transistor $T_1$, a second transistor $T_2$, a dummy word line 433, a comparator 434 and an inverter 435. The first resistor $R_1$ has a first terminal coupled to a first voltage, which is an operation voltage $V_{cc}$. The second resistor $R_2$ has a first terminal coupled to a second terminal of the first resistor $R_1$. The first transistor $T_1$ and the second transistor $T_2$ are NMOS field effect transistors to be described in the example.

The first terminal of the first transistor $T_1$ is coupled to a second terminal of the second resistor $R_2$, and the second terminal of the first transistor $T_1$ is coupled to a second voltage, which is a ground voltage GND. The control terminal of the first transistor $T_1$ receives the enable reading signal ENRD. The dummy word line 433 is the same as one of the word lines $WL_1$ to $WL_m$. The dummy word line 433 has a first terminal coupled to the control terminal of the first transistor $T_1$. The comparator 434 has a first input terminal coupled to a second terminal of the dummy word line 433, a second input terminal coupled to the second terminal of the first resistor $R_1$, and an output terminal for outputting the switching signal SW.

The inverter 435 has an input terminal for receiving the enable reading signal ENRD. The second transistor $T_2$ has a first terminal coupled to the first input terminal of the comparator 434, a second terminal coupled to a second voltage GND, and a control terminal coupled to the output terminal of the inverter 435. A ratio of the resistance of the second resistor $R_2$ to a sum of the resistances of the first resistor $R_1$ and the second resistor $R_2$ is a ratio of the pre-charge voltage $V_{pc}$ to the initial enable voltage $V_1$. That is, $R_2/(R_1+R_2)=V_{pc}/V_1$. In addition, the voltage at the node X is $V_X$, and $V_{pc}/V_1=V_X/V_{cc}$.

In the pre-charge control unit 432, when the voltage level of the enable reading signal ENRD is low, the first transistor $T_1$ turns off, and the second transistor $T_2$ turns on. Thus, the voltage level at the node Q is equal to the voltage level (i.e., the first voltage $V_{cc}$) at the node X, and the voltage level at the node P is equal to the second voltage GND. Consequently, the voltage level at the first input terminal of the comparator 434 is the second voltage GND, and the voltage level at the second input terminal of the comparator 434 is the first voltage $V_{cc}$. Therefore, the voltage level of the switching signal SW outputted from the output terminal of the comparator 434 is low, and the multiplexer 431 outputs the initial enable voltage $V_1$ to the row decoder 420 to charge the target word line rapidly.

When the voltage level of the enable reading signal ENRD is high, the first transistor $T_1$ turns on and the second transistor $T_2$ turns off. Thus, the voltage level at the node Q is equal to the voltage level at the node X, and the voltage level at the node P is equal to the voltage level at the dummy word line 433. After the pre-charge time $t_{pc}$ and when the voltage level of the dummy word line 433 is charged to the pre-charge voltage $V_{pc}$ by the enable reading signal ENRD, the voltage level at the first input terminal of the comparator 434 is equal to the voltage level at the second input terminal of the comparator 434, so the voltage level of the switching signal SW outputted from the output terminal of the comparator 434 is high, and the multiplexer 431 outputs the target voltage $V_0$ to the row decoder 420 to charge the target word line to the target voltage $V_0$.

Figure 6:
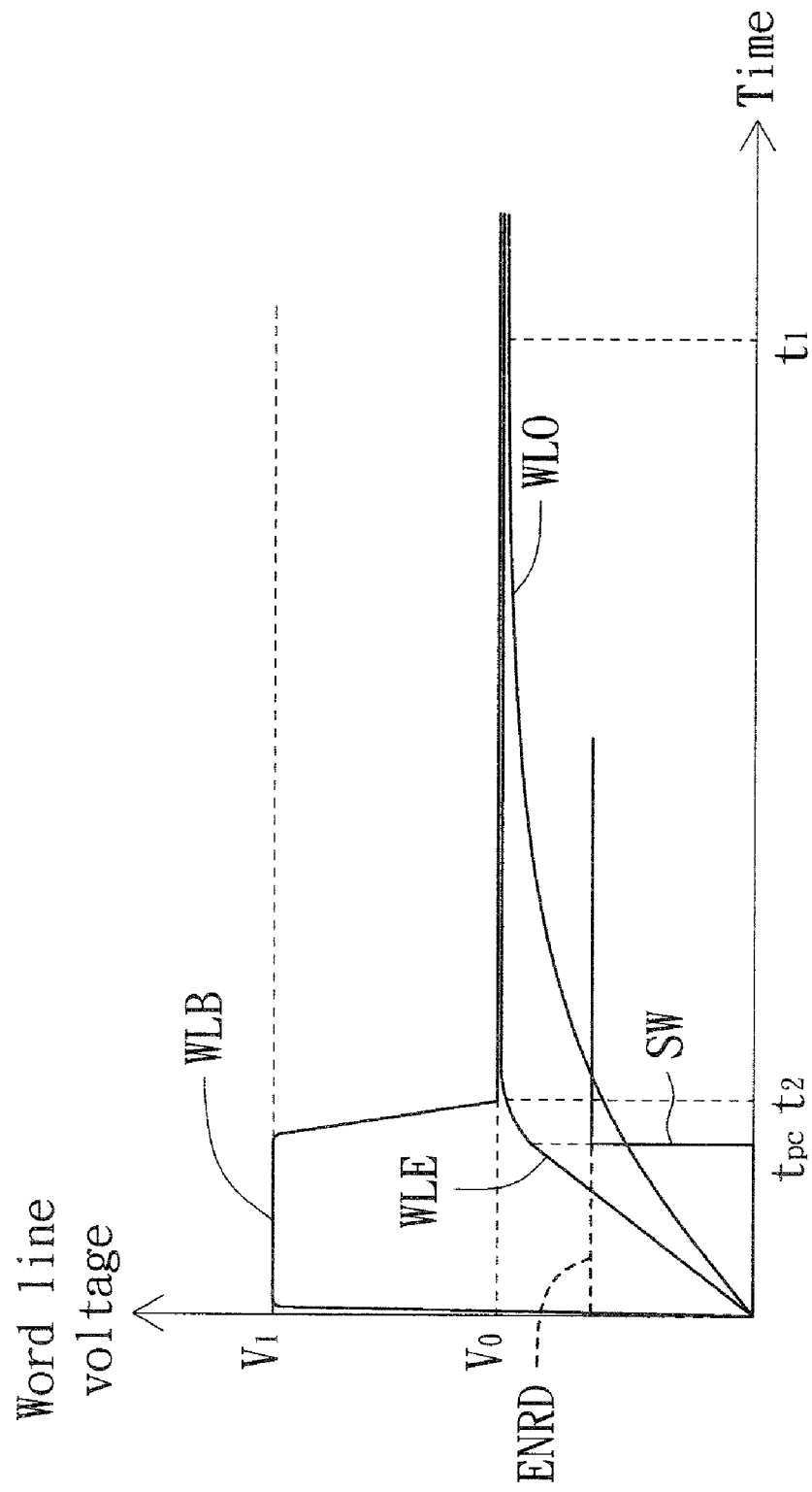
FIG. 6 shows waveforms of target word line voltages versus time according to the preferred embodiment of the invention.

FIG. 6 shows waveforms of target word line voltages versus time according to the preferred embodiment of the invention, wherein WLB represents the voltage curve at the starting end of the target word line, WLE represents the voltage curve at the ending end of the target word line, and WLO represents the voltage curve when the target word line is directly charged by the target voltage. The starting end of the target word line is rapidly charged to the initial enable voltage $V_1$ at the beginning, and then the voltage thereof is lowered to the target voltage $V_0$ after the pre-charge time $t_{pc}$. In FIG. 6, it is clear that the charge time of $(t_1-t_2)$ is saved, and the delay of the target word line is thus reduced.

In the NOR architecture memory and the operation method thereof according to the embodiment of the invention, the target word line is rapidly charged with the higher initial enable voltage at the beginning. After the pre-charge time, the initial enable voltage is switched to the target voltage so that the target word line is charged to the target voltage. Consequently, the delay of the target word line can be greatly reduced without enlarging the area of the NOR architecture memory.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An operation method for a NOR architecture memory, the method comprising the steps of:
   selecting a target word line;
   applying an initial enable voltage to the target word line to charge the target word line; and
   switching the initial enable voltage, which is higher than a target voltage, to the target voltage after a pre-charge time to make the target word line be charged to the target voltage,
   wherein the pre-charge time corresponds to the initial enable voltage and the target voltage.

2. The method according to claim 1, wherein in the pre-charge time, the target word line is charged to a pre-charge voltage slightly lower than the target voltage.

3. The method according to claim 2, wherein when the target word line is charged to the target voltage, a row of memory cells corresponding to the target word line is enabled.

4. The method according to claim 1, wherein the NOR architecture memory is a non-volatile memory.

5. The method according to claim 4, the NOR architecture memory is a flash memory.

6. An NOR architecture memory, comprising:
   a NOR architecture memory cell array having a plurality of memory cells arranged in an array having m rows and n columns, m and n being positive integers;
   m word lines respectively corresponding to the m rows of memory cells, wherein each of the word lines is coupled to n gates of the corresponding row of memory cells;
   a row decoder for selecting one of the word lines as a target word line; and
   a control circuit, which is coupled to the row decoder, applies an initial enable voltage to the target word line to charge the target word line, and then switches the initial enable voltage to a target voltage after a pre-charge time to make the target word line be charged to the target voltage, wherein the initial enable voltage is higher than the target voltage.

7. The memory according to claim 6, wherein the pre-charge time corresponds to the initial enable voltage and the target voltage.

8. The memory according to claim 7, wherein the target word line is charged to a pre-charge voltage, which is slightly lower than the target voltage, in the pre-charge time.

9. The memory according to claim 8, wherein the control circuit comprises:
   a pre-charge control unit controlled by an enable reading signal to output a switching signal; and
   a multiplexer having a first input terminal coupled to the initial enable voltage, a second input terminal coupled to the target voltage, and a control terminal for receiving the switching signal, wherein the multiplexer decides to output the initial enable voltage or the target voltage to the row decoder according to the switching signal.

10. The memory according to claim 9, wherein the pre-charge control unit comprises:
    a first resistor having a first terminal coupled to a first voltage;
    a second resistor having a first terminal coupled to a second terminal of the first resistor;
    a first transistor having a first terminal coupled to a second terminal of the second resistor, a second terminal coupled to a second voltage, and a control terminal for receiving the enable reading signal;
    a dummy word line, which is the same as one of the word lines, and has a first terminal coupled to the control terminal of the first transistor;
    a comparator having a first input terminal coupled to a second terminal of the dummy word line, a second input terminal coupled to the second terminal of the first resistor, and an output terminal for outputting the switching signal;
    an inverter having an input terminal for receiving the enable reading signal; and
    a second transistor having a first terminal coupled to the first input terminal of the comparator, a second terminal coupled to the second voltage, and a control terminal coupled to an output terminal of the inverter, wherein a ratio of a resistance of the second resistor to a sum of a resistance of the first resistor and the resistance of the second resistor is a ratio of the pre-charge voltage to the initial enable voltage.

11. The memory according to claim 10, wherein the first transistor and the second transistor are NMOS field effect transistors.

12. The memory according to claim 11, wherein the first voltage is an operation voltage and the second voltage is a ground voltage.

13. The memory according to claim 6, the NOR architecture memory is a non-volatile memory.

14. The memory according to claim 13, the NOR architecture memory is a flash memory.

* * * * *